United States Patent [19]

Maloberti et al.

[11] Patent Number: 5,281,924
[45] Date of Patent: Jan. 25, 1994

[54] FULLY DIFFERENTIAL CMOS POWER AMPLIFIER

[75] Inventors: Franco Maloberti, Torre d'Isola; Giuseppe Palmisano, Pavia; Luigi Sforzini, Sedriano; Giuseppe Gazzoli, Cremona, all of Italy

[73] Assignee: Italtel Societa Italiana Telecomunicazione S.p.A., Milan, Italy

[21] Appl. No.: 849,363

[22] PCT Filed: Nov. 1, 1990

[86] PCT No.: PCT/EP90/01839
§ 371 Date: May 5, 1992
§ 102(e) Date: May 5, 1992

[87] PCT Pub. No.: WO91/07814
PCT Pub. Date: May 30, 1991

[30] Foreign Application Priority Data

Nov. 13, 1989 [IT] Italy .................. 22362 A/89

[51] Int. Cl.⁵ .................................. H03F 3/45
[52] U.S. Cl. ......................... 330/253; 330/258
[58] Field of Search ........... 330/51, 253, 258, 261, 330/277, 296, 311

[56] References Cited

U.S. PATENT DOCUMENTS 4,658,219  4/1987  Saari et al. ............... 330/253
4,794,349 12/1988  Senderowicz et al. ..... 330/258 X

FOREIGN PATENT DOCUMENTS 0234806  9/1987  European Pat. Off. .
0294880 12/1988  European Pat. Off. .
1162952 10/1962  Fed. Rep. of Germany .

OTHER PUBLICATIONS

Journal of Solid-State Circuits, Jun. 24, 1989, No. 3, New York, U.S. "A Floating CMOS Bandgap Voltage Reference for Differential Applications".

Primary Examiner—Steven Mottola

[57] ABSTRACT

A fully differential CMOS power amplifier having a folded-cascode input stage, an AB class output stage, a first common mode feedback circuit that stabilizes the input stage, and a second common mode feedback circuit that stabilizes the output stage. Each feedback circuit feeds back to an internal node of its particular stage. The power amplifier also includes a power dissipation reduction circuit that shuts down the power amplifier's output first and then the rest of the power amplifier, when the power amplifier is idle for a certain period. This reduction circuit activates the power amplifier in the reverse order.

13 Claims, 5 Drawing Sheets

[CMF 1]

FULLY DIFFERENTIAL CMOS POWER AMPLIFIER

The present invention concerns a fully differential power amplifier implemented as an integrated circuit in CMOS technology operating with one single power supply voltage, e.g. 5 V; The chip on which the circuit is integrated contains also a digital part.

The amplifier according to the invention is able to drive a low impedance load in order of a few hundreds ohms with a low harmonic distortion and a wide output dynamic range, e.g. 4 Vpp (peak to peak voltage) if a 5 V power supply is used. The amplifier according to the invention is useful in those cases where it is necessary to drive low impedance loads with a wide dynamic range in relationship to the power supply voltage, low distortion and high common mode rejection ratio as well as a low power consumption.

The circuit in this preferred application drive a mixer, for RF carrier modulation in a telecommunication system.

The U.S. Pat. No. 4,794,349 patent describes a differential power amplifier with three cascaded stages, one input stage, one gain stage and one output stage, respectively. This well known circuit has some drawbacks and limitations that make the circuit unsuitable for the above mentioned tasks.

More precisely, the gain stage layout is not perfectly symmetric and may give rise to output distortions in case of mismatch between the gains of the two differential input stages. Besides the high complexity of this stage considerably limits the circuit bandwidth.

The output stage configuration according to the U.S. Pat. '349 needs a control circuit to limit the rest current variations of the transistors in the two extreme branches, associated to possible technological inaccuracies in the integrating process.

Finally, the circuit according to the U.S. Pat. '349 has a high power consumption even in idle state, which makes it improper to be used with battery power supply. In contrast, the purpose of this invention is to obtain a substantially fully differential power amplifier overcoming the limitations of the former technique and in particular a power amplifier having wide dynamic range as well as a good Power Supply Rejection Ratio (PSRR) and low power consumption.

The preferred structure exhibits high noise rejection so that it is possible to integrate the circuit in a chip that also contains a digital part. The circuitry layout is fully symmetrical with respect to the two differential paths and permits a symmetrical layout from a geometrical point of view.

This symmetric differential path aspect of the preferred embodiment is very important to the objective of high rejection of the noise coming from the substrate and the power supply lines, mainly caused by switching of the digital part. Said noise affect the two differential paths substantially identical and is translated into substantially only common mode noise, while the differential signal is not substantially affected of any noise.

These purposes are obtained by means of the preferred embodiment of invention that consists in a fully differential CMOS power amplifier comprising:

one input stage of the folded-cascode type having two input terminals;

one AB class output voltage stage, the inputs of which are connected to outputs of said input stage, respectively;

a first common mode feedback circuit connected between the output of said input stage and an internal node of said input stage;

a second common mode feedback circuit associated to said output stage;

characterized by the fact that said second common mode feedback circuit is connected between the output of said output stage and an internal low impedance junction thereof, so as to produce a reduction of the common mode signal at the output of the amplifier by injection of two feedback currents;

and by the fact that said power amplifier comprises a power dissipation reduction circuit which during the idle periods of the amplifier is able to connect both said outputs of the output stage to a voltage reference through a pair of controlled switches and thereafter, after a predetermined delay, to turn off the whole amplifier through a plurality of controlled switches. A fully differential amplifier is considered in the article "a floating CMOS bandgap voltage reference for differential application", M. Ferro, F. Salerno, R. Castello published in the IEEE Journal of Solid-State Circuits, Vol. 24, No. 3, June 1989.

In this article is presented a bandgap voltage reference, that uses a differential amplifier to generate a precise floating reference voltage.

The Ferro et al. amplifier is a fully differential amplifier comprising an input and an output serially connected stages and a common mode feedback circuit associated to each of said stages, wherein the output stage of the common mode feedback circuit of the output stage is connected again to the output of final stage.

Thus a compensating current is directly injected into the output, whereas in the instant preferred embodiment of the invention the output of the second common mode feedback circuit is connected to a point within the final amplifier and more particularly to an internal low impedance node.

This way a current feedback is obtained, that achieves an improved bandwidth and compensates, for the common mode disturbances, at higher frequencies, which is one of the objects of the invention. The Ferro et al. amplifier is adapted to drive a minimum load of 2 kohm load whereas the device of the invention is adapted to drive a load which is at least 10 times smaller. Moreover, no power dissipation reduction circuit is provided for by the Ferro et al. reference, and particularly one with a two-stage operation in order to prevent disturbances being transmitted each time the amplifier is switched on and off.

Further characteristics and advantages of the invention will be evidenced by the following description related, but not limited, to a preferred form of the invention, which is illustrated in the attached figures.

DESCRIPTION OF THE PREFERRED EMBODIMENT

Figure 1:
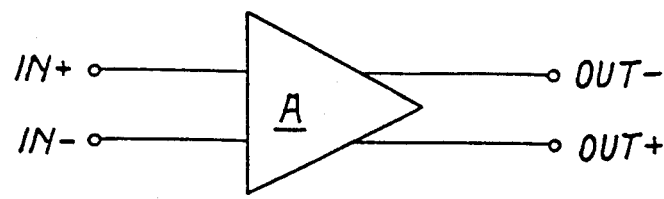
FIG. 1 shows the power amplifier according to the invention evidencing the completely differential structure.

As can be seen in FIG. 1, the amplifier A according to the invention has a fully differential structure, i.e. both the input and the output are of differential type.

Figure 2:
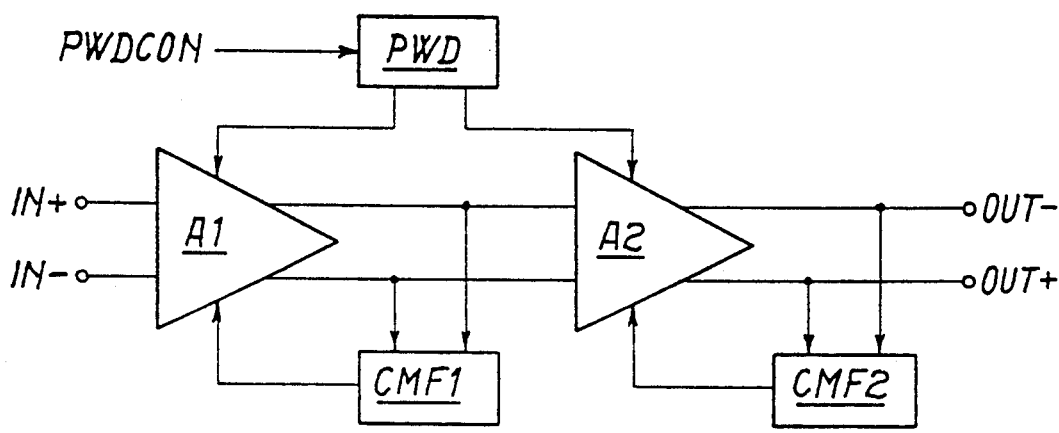
FIG. 2 shows a detailed block diagram of the amplifier according to the invention.

More precisely, as can be seen in FIG. 2, it comprises a differential input stage designated by A1 having two inputs (IN+ and IN−) receiving two counterphase signals and one output stage designated by A2, also of differential type, at the outputs of which OUT+ and OUT− is present the amplified signal. In particular, AB class amplifier A2 is able to generate output currents suitable to drive a low impedance load with very low signal distortion.

The amplifier circuit also comprises two common mode feedback circuits CMF1 and CMF2 for stabilizing the common mode voltage and a power down (PWD) circuit to reduce the power dissipation, the control of which is schematically indicated by the signal PWDCON.

Figure 3:
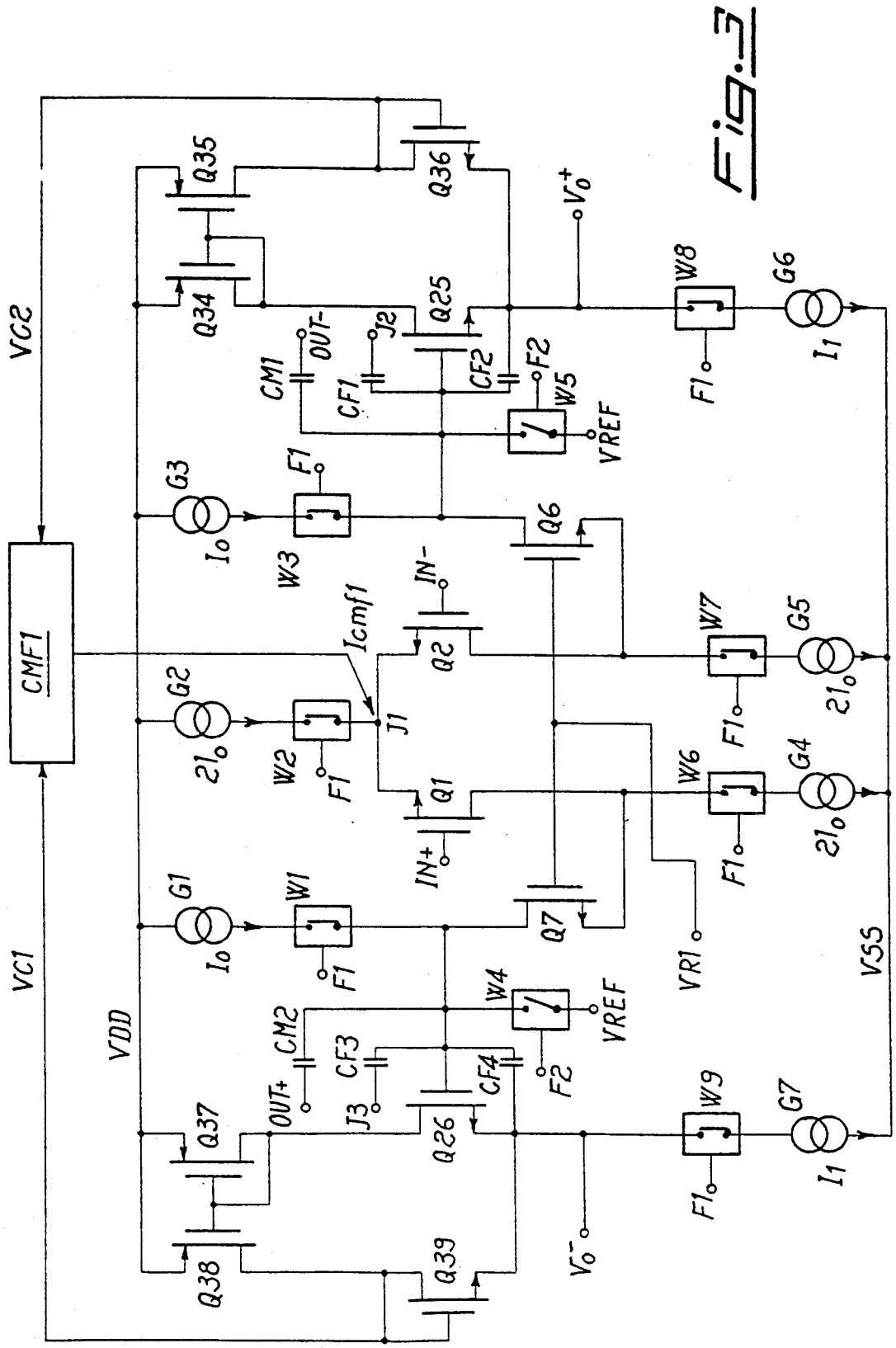
FIG. 3 is a schematic diagram of the input stage of the amplifier circuit.

The input stage is illustrated in detail in FIG. 3. It is a balanced stage in the folded-cascode configuration consisting of two MOS transistors Q1 and Q2 connected to the common source (node J1), the gates of which are two differential inputs, whereas the differential output signal is available on the drains of said transistors. Current generator G2 injects a constant current into nodo J1, while current generators G4 and G5 constitute a high impedance load for the signal.

The differential pair consisting of Q1 and Q2 is followed by two transistors Q7 and Q6, the gates of which are tied to a reference voltage VR1. The differential signal entering the terminals IN+ and IN− is amplified when reaching the drains of the transistors Q6 and Q7; then it is buffered and translated, by Q25 and Q26, to a voltage (Vo+, Vo−) suitable to drive the following output stage.

The voltage present on the drains of the transistors Q6 and Q7 is reproduced on the drains of the transistors Q36 and Q39 (VC2, VC1) and then used by the common mode feedback circuit CMF1 to optimize the input stage dynamic. In this way, the common feedback circuit CMF1 can read the instantaneous output voltage variation of the first stage without altering the load on the drains of Q6 and Q7. Correction takes place by injecting an $Icmf_1$ current proportional to the detected common mode voltage, into node J1 common to the sources of Q1 and Q2. Said current, which together with the bias component 2Io produced by the current generator G2, forms an algebric sum, is able to feed back the voltage on the drains of Q6 and Q7 at half of the power supply voltage.

FIG. 3 also shows some current generators from G1 to G7 producing currents Io or 2Io illustrated in the figure. The two transistor pairs Q34-Q35 reflect the drain currents of Q25 and Q26, respectively. In this way, if neglecting the current component drained by circuit CMF1 in presence of the differential signal, the transistor Q39 conducts the same drain current of Q26 and also the transistor Q36 conducts the same current of Q25. Consequently, voltages VC1 and VC2 are a true reflection of the voltages present on the drains of Q7 and Q6, respectively.

Besides, the presence of power dissipation reduction (PWD) circuit has been drawn with switches W1-W9 controlled by signals F1 and F2, which will be illustrated in detail in the following text. As regards the input stage operation under regular conditions, i.e. not in idle state, said switches are supposed to be positioned as shown in the FIG. 3.

Finally, FIG. 3 shows voltages VREF, VSS and VDD being the 2.5 V reference voltage, ground and the +5 V power supply voltage, respectively.

For the sake of completeness, FIG. 3 shows compensating capacitors CM1, CM2, CF1, CF2, CF3, CF4. More precisely and with reference to FIG. 4 as well, CM1 is connected between the gate of Q25 and output OUT− of the power amplifier. CM2 is connected between the gate of Q26 and output OUT+ of the power amplifier. Said capacitors CM1 and CM2 constitute a dominating pole compensation. CF1 is connected between the gate of Q25 and node J2 common to the gates M6 and M8. CF3 is connected between the gate of Q26 and node J3 common to the gates M5 and M7. CF2 and CF4 are connected between the gate and source of Q25 and Q26, respectively. Capacitors CF1, CF2, CF3 and CF4 constitute a feedforward compensation permitting to optimize the phase margin of the amplifier.

Figure 4:
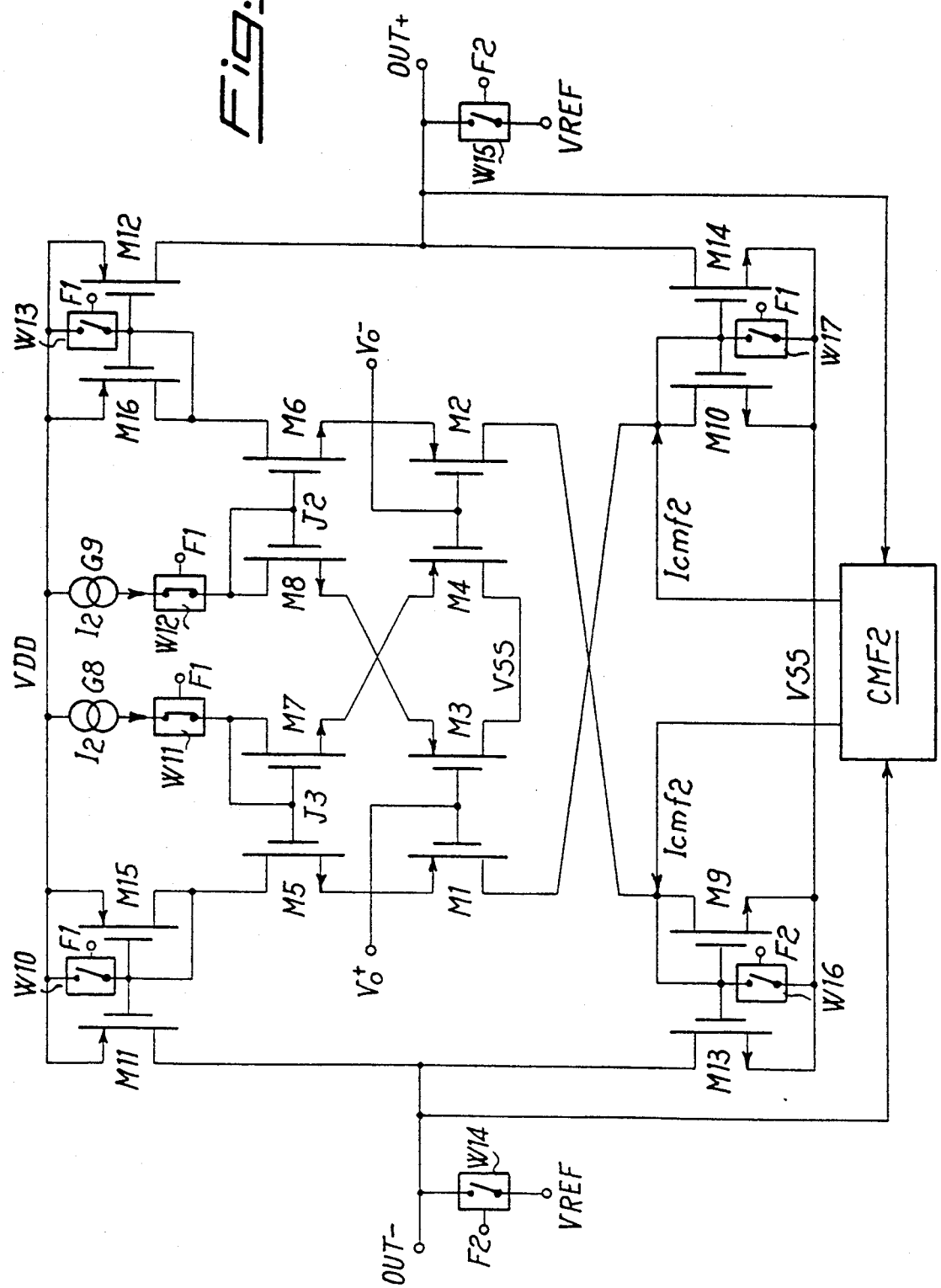
FIG. 4 is a schematic diagram of the output stage of the amplifier circuit.

FIG. 4 shows the output stage A2, the core of which consists of a transconductance amplifier made up of transistors M1, M2, M3, M4, M5, M6, M7 and M8. Signals Vo+, Vo− coming from the input stage A1 are applied to the gates of M1 and M2 and after voltage translation they are fed back to the gates of M6 and M5 by means of transistor pairs M4-M7 and M3-M8.

The transconductance stage currents present on the branches identified by M1 and M5, and by M2 and M6, respectively are mirrored in a ratio of 1 to 10, then they are recombined thus generating the two counterphase output voltages OUT+ and OUT−. There are four current mirrors consisting of the pairs M11 and M15, M12 and M16, M9 and M13, M10 and M14. A current ten times the current flowing through the drains of M15, M16, M9 and M10, respectively, is mirrored in the drains of the transistors M11, M12, M13 and M14. In this case common mode feedback circuit CMF2 directly reads the output voltages and, depending on the detected common mode signal, it injects two equal currents $Icmf_2$ in correspondence with the drains of M9 and M10. In this way, a voltage, the average value of which equals half the power supply voltage, is restored in output nodes OUT+ and OUT−.

FIG. 4 also shows the current generators G8 and G9 that force a substantially constant current $I_2$ to the transistor pairs M7 and M4, M8 and M3, respectively.

Also in the output stage shown in FIG. 4, the PWD circuit effect is drawn by several switches W10-W17 controlled by signals F1 and F2, as can be seen in the figure.

As already stated, in the input stage A1 as well as in output stage A2 of the power amplifier circuit according to the preferred embodiment of the invention, a common mode feedback circuit is provided to optimize the whole amplifier dynamic range.

Figure 5:
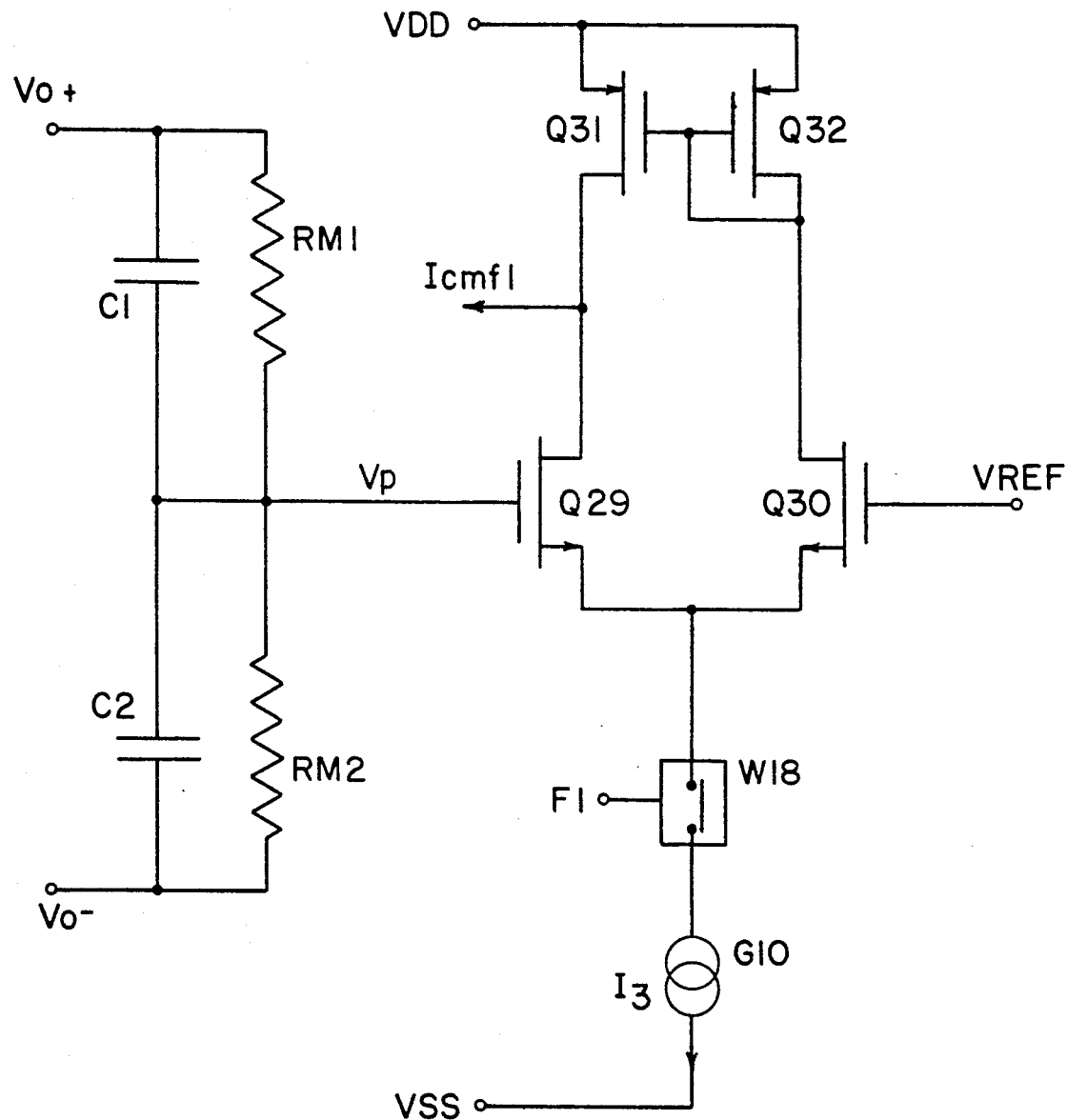
FIG. 5 shows the common mode feedback circuit of the input stage.

The common mode feedback circuit CMF1 of the input stage A1 is shown in detail in FIG. 5.

The detection of the common mode signal; i.e. of the average voltage (Vo+ and Vo−) shift from the reference voltage VREF (where VREF equals half the power supply voltage) is obtained by means of a resistive partition consisting of two equal resistors RM1 and RM2, to the ends of which are applied the stage output voltages Vo+ and Vo− to be stabilized. Two capacitors C1 and C2 with equal value are connected in parallel to the resistors RM1 and RM2; they are designed to stabilize the common mode feedback loop.

The voltage Vp present in the center of the voltage divider, proportional to the common mode signal, is compared with the reference voltage VREF by means of the differential stage constituted of Q29 and Q30. If the center of the voltage divider shifts from VREF, the transistors Q29, Q30, Q31 and Q32 generate a current signal $Icmf_1$; as already mentioned, this signal forms an algebraic sum with the current 2Io, injected into the transistors Q1 and Q2 of the differential input stage, thus restoring an quiescent voltage equal to the VREF on the drains of transistors Q7 and Q6.

The current generator G10 generates current $I_3$ biasing the stage consisting of Q29, Q30, Q31 and Q32 so that the current $Icmf_1$ is enough to feed back the average value of Vo+ and Vo− to the reference voltage VREF. W18 is a part of the circuit PWD previously described.

Said circuit "reads" the common mode voltages (i.e. the average value of voltages Vo+ and Vo−) and produces an internal signal attenuating the noise without altering the differential signal. In this way, the circuit CMF1 returns the average value of the two voltages Vo+ and Vo− to a reference value VREF applied to the correcting circuit, and that allows the circuit to obtain the maximum output dynamic range.

This type of circuit achieve a high gain of the common mode feedback loop and a bandwidth comparable to that of the whole amplifier. In this way, a small common mode error over the whole bandwidth is obtained.

Figure 7:
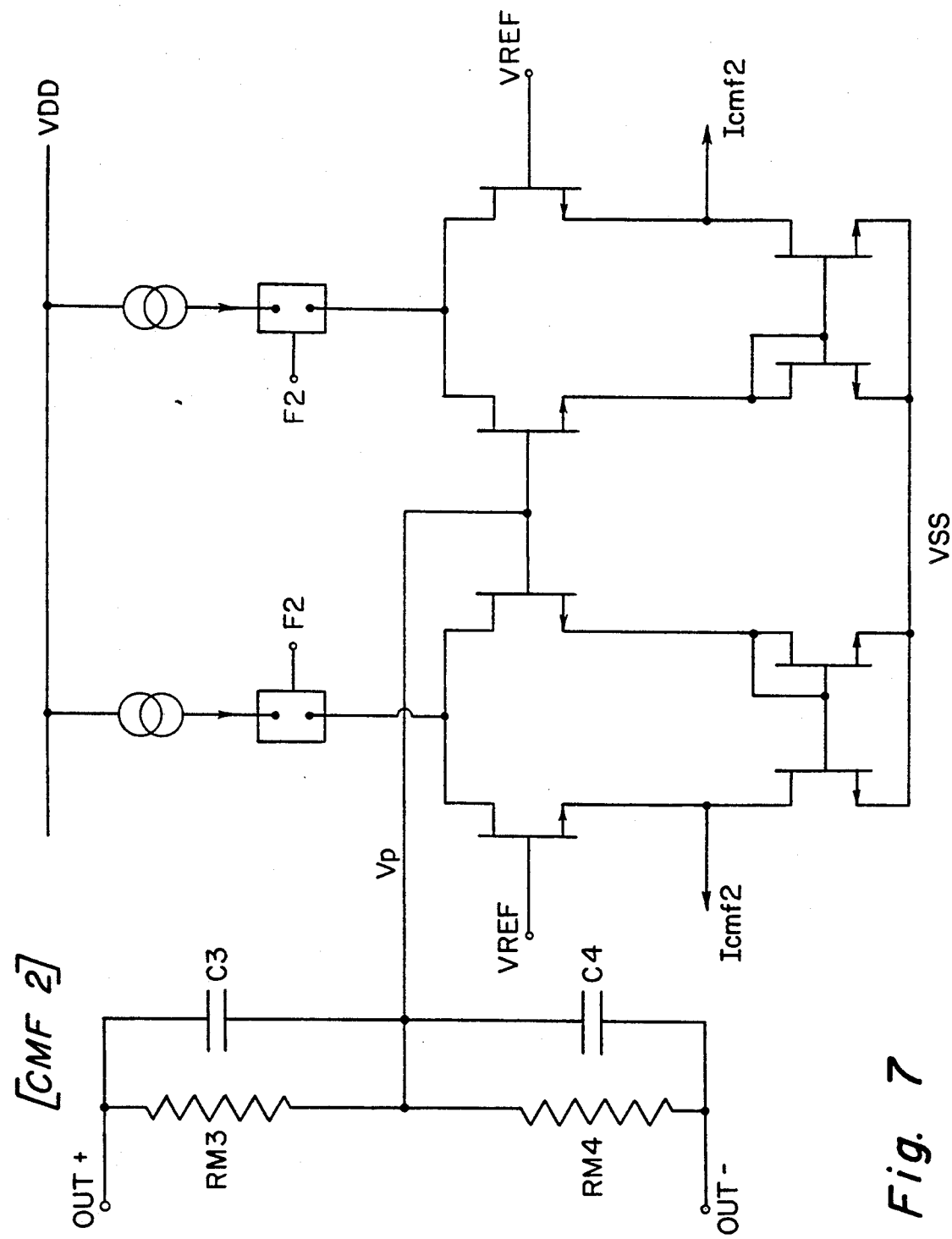
FIG. 7 shows the common mode feedback circuit of the output stage of the amplifier circuit.

As common mode feedback circuit CMF2 of the output stage has a similar configuration (see for example, FIG. 7), but with a common mode feedback circuit which is twice that of the input stage, i.e. the part of the circuit between the center node of the resistive partition and VREF. In other words, the second common mode feedback circuit (CMF2) comprises a resistive partition realized by means of two resistors with equal value, serial connected between the output voltages (OUT+, OUT−) of the output stage (A2) to be stabilized. Circuit CMF2 is provided with a capacitor that is (C3, C4) parallel connected to each one of the two series connected resistors (RM3, RM4) that constitute the voltage divider. The capacitors have the same capacity.

As already stated, FIGS. 3 and 4 show the power dissipation reduction circuit PWD with controlled switches W1-W18, which during regular operation of the amplifier circuit, are in the state indicated in the figures.

The PWD circuit operation is particularly useful when the circuit according to the invention preferred embodiment of the is a built-in part of portable devices with battery power supply, wherein part of the circuit remains in idle state for a certain period, such as e.g. half duplex transceivers where, during reception the transmit section is in idle state and vice versa. Another typical case is that of data transmission systems operating according to the TDMA (Time Division Multiple Access) technique, in which the turn-on of the single equipment is accomplished according to time slots. In particular, the PWD circuit according to the invention may be activated or disactivated in very short time of the order of a few hundreds of microseconds. The switch on and switch off transitions of the amplifier circuit must be very short and no spurious signals caused by them should be present at the differential outputs.

Figure 6:
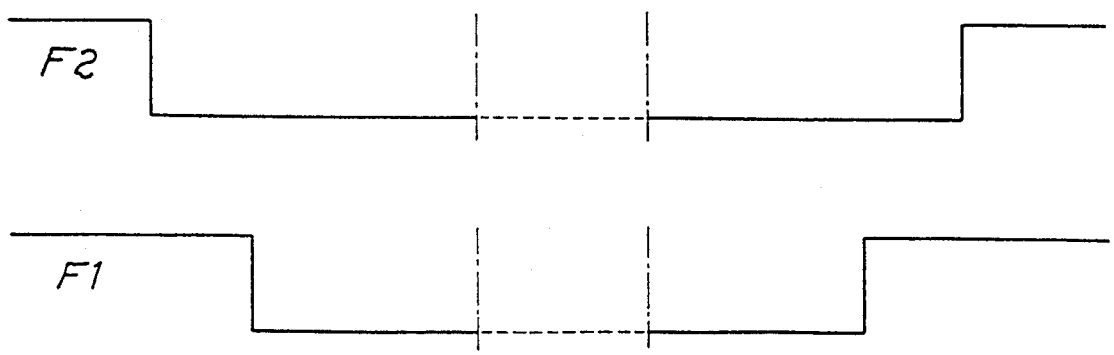
FIG. 6 shows the time diagrams of the two control phases of the power dissipation (PWD) reduction circuit.

The power dissipation reduction circuit has two control signals or phases designated by F1 and F2 on the command electrodes of the controlled switches W1-W8. The time diagram of the two phases is shown in FIG. 6.

On the falling edge of phase F2 the drains of transistors Q6 and Q7 of FIG. 3 and the drains of transistors M11, M12, M13, M14 of FIG. 4 are connected across at the 2.5 V reference voltage by means of switches W14 and W15 controlled by phase F2. Hence the amplifier outputs are inhibited for the whole period F2 is at a low level.

The following falling edge of the control signal F1 causes switching off of the remaining analog part of the amplifier according to the invention as well as of any other circuit which is part of the chip.

The advantage of inhibiting the amplifier outputs before turning off the chip is that it permits isolation of the outputs from all spurious transitions caused by turning off and on the amplifier itself and of all circuits connected before the power amplifier.

Turning off the input stage of the amplifier A1 is accomplished by switching off the current generators G1-G7 shown in FIG. 3 and forcing to zero the reference voltage VR1. Turning off the output stage of the amplifier A2 is accomplished by switching off the current generators G8 and G9 and short circuiting the gates of the transistors M11, M15, M16 and M12 to VDD and the gates of M13, M9, M10 and M14 to VSS by means of switches W10, W13, W16 and W17 shown in FIG. 4.

In these conditions the power dissipation is reduced to the value of a few nW. As regards re-switching on (or activating) the amplifier, the rising edge of F1 (see FIG. 6) causes the whole chip to turn on again. Being the drains of Q6, Q7, M11, M12, M13 and M14 still shortcircuited towards reference voltage VREF, the transition switch-on signal cannot propagate to the amplifier outputs. The drains of these transistors are released only later on the rising edge of F2 and at this time the circuit is fully reactivated.

Besides, another advantage of the preferred embodiment of the invention is the elimination of the conversion circuit from differential to single-end present in the devices with non differential outputs. Such a conventional circuit introduces further time constants that limit bandwidth. Thus, the preferred embodiment of the invention achieves an increased amplifier signal bandwidth.

We claim:

1. A substantially fully differential CMOS power amplifier having an output comprising: a folded-cascode input stage having an input including a plurality of input terminals and having an output including a plurality of output terminals;

an AB class output, having an input including a plurality of input terminals connected to the output terminals of said input stage, respectively, and having an output comprising a plurality of output terminals;

a first common mode feedback circuit having an input connected to the output of said input stage, and having an output including a plurality of output terminals connected to an internal node of said input stage;

a second common mode feedback circuit having plural inputs and outputs, connected between the plural outputs of said output stage and at least two internal low impedance junctions of said output stage, said second common mode feedback circuit reducing a common mode signal at the output of said power amplifier by injection of plural feedback currents commensurate in number with said at least two junctions to which said second common mode feedback means is connected.

2. A power amplifier according to claim 1, further comprising power dissipation reduction means for connecting said plurality of output stage output terminals to a voltage reference through at least two controlled switches during idle periods of operation of said power amplifier, and turning off the power amplifier through a plurality of controlled switches after a predetermined delay.

3. A power amplifier according to claim 1, wherein: said output stage further comprises:
   a transconductance amplifier having an input, connected to said outputs of said input stage, and an output; and
   at least two current mirrors each having an output; same said at least two current mirrors amplifying said transconductance amplifier's output; and wherein said power amplifier's output is a function of said output of each of said at least two current mirrors.

4. A power amplifier according to claim 2, wherein said power dissipation reduction means further comprises: a first set of commanded switching means, controlled as a function of a first control signal, for selectively inhibiting the power amplifier's output, and a second set of commanded switching means controlled as a function of a second control signal for selectively inhibiting all remaining portions of said power amplifier, wherein a first edge of said first control signal is delayed with respect to a first edge of said second control signal when inhibiting said power amplifier's operation, and the second edge of said second control signal is delayed with respect to a second edge of said first control signal when switching on said amplified circuit.

5. A power amplifier according to claim 2 wherein: said input stage further comprises: a first transistor set of at least two transistors, each transistor of said set including a source electrode, a gate electrode, and a drain electrode; and a substantially constant current generator, wherein said source electrodes of said first set are connected to a common node; wherein said gate electrodes form at least two differential inputs; wherein said generator is connected to said common node and to the output of said first common mode feedback circuit; and said first common mode feedback circuit further comprises: a first correction current generating means, connected to said common node, for injecting a correction current into said common node.

6. A power amplifier according to claim 5, wherein: the drain electrodes of the transistors of said first set are connected to source electrodes of a second set of at least two transistors, respectively, each transistor of said second set having a gate electrode tied to a first reference voltage (VR1).

7. Amplifier circuit according to claim 6, wherein: said input stage comprises: a third set of at least two transistors, each transistor of said set including a source electrode, a gate electrode, and a drain electrode; wherein the gate electrodes of said third set are connected to the drain electrodes respectively of said second set and the source electrodes of said second set are connected to inputs of the output stage, respectively.

8. Amplifier circuit according to claim 7, wherein: said input stage further comprises: a fourth set of at least two transistors, each transistor of said set including a source electrode, a gate electrode, and a drain electrode, connected to the transistors of said third set; and wherein the gate electrodes of said third set are connected to the inputs of the first common mode feedback circuit.

9. A power amplifier according to claim 3, wherein: said outputs of said second common mode feedback means are connected to said at least two current mirrors in order to inject at least two substantially equal correction currents into said at least two current mirrors.

10. Amplifier circuit according to claim 1, wherein: said first common mode feedback circuit comprises: a first voltage divider having a central node, said first voltage divider connected between the output terminals of the input stage whereby said input stage is stabilized.

11. Amplifier circuit according to claim 1, wherein: said second common mode feedback circuit comprises: a second voltage divider connected between the output terminals of the output stage whereby said output stage is stabilized.

12. Amplifier circuit according to claim 10, wherein said first voltage divider comprises: a capacitor parallel connected to each of at least two series connected resistors of substantially the same resistance, said capacitors being of substantially the same capacity.

13. Amplifier circuit according to claim 10, wherein: said first common mode feedback circuit comprises: a balanced stage, having inputs connected respectively to the central node of said first voltage divider and to a reference voltage suitable to generate a correction current proportional to a difference between a voltage of said central node and said reference voltage.

* * * * *